US007570062B2

(12) United States Patent
Mills et al.

(10) Patent No.: US 7,570,062 B2
(45) Date of Patent: Aug. 4, 2009

(54) METHOD OF ACTUATING A TEST FUNCTION OF AN ELECTRICAL SWITCHING APPARATUS AND ELECTRICAL SWITCHING APPARATUS EMPLOYING THE SAME

(75) Inventors: Patrick W. Mills, Bradenton, FL (US); Kevin D. Gonyea, Bradenton, FL (US); Richard G. Benshoff, Sarasota, FL (US)

(73) Assignee: Eaton Corporation, Cleveland, OH (US)

( * ) Notice: Subject to any disclaimer, the term of this patent is extended or adjusted under 35 U.S.C. 154(b) by 376 days.

(21) Appl. No.: 11/008,067

(22) Filed: Dec. 10, 2004

(65) Prior Publication Data

US 2006/0125582 A1 Jun. 15, 2006

(51) Int. Cl.
*G01R 31/327* (2006.01)
*H02H 3/00* (2006.01)

(52) U.S. Cl. ............................ 324/415; 324/424; 361/1

(58) Field of Classification Search ......... 324/415–424, 324/66, 67; 361/1, 42, 179

See application file for complete search history.

(56) References Cited

U.S. PATENT DOCUMENTS

| | | | | |
|---|---|---|---|---|
| 3,907,237 | A * | 9/1975 | Staples | 246/34 A |
| 4,081,852 | A | 3/1978 | Coley et al. | |
| 4,280,164 | A * | 7/1981 | Kozek | 361/179 |
| 4,443,716 | A * | 4/1984 | Avery | 307/116 |
| 4,532,571 | A * | 7/1985 | Satou | 361/93.5 |
| 4,710,751 | A * | 12/1987 | Webster | 340/522 |
| 4,845,429 | A * | 7/1989 | Burreson | 324/234 |
| 4,845,476 | A * | 7/1989 | Rangeard et al. | 340/660 |
| 5,224,006 | A | 6/1993 | MacKenzie et al. | |
| 5,260,676 | A | 11/1993 | Patel et al. | |
| 5,293,522 | A | 3/1994 | Fello et al. | |
| 5,408,132 | A * | 4/1995 | Fericean et al. | 307/116 |
| 5,422,564 | A * | 6/1995 | Earle et al. | 324/67 |
| 5,459,630 | A | 10/1995 | MacKenzie et al. | |
| 5,691,869 | A | 11/1997 | Engel et al. | |
| 5,938,382 | A * | 8/1999 | Andre et al. | 410/24 |
| 5,969,920 | A | 10/1999 | Mackenzie | |
| 5,982,593 | A * | 11/1999 | Kimblin et al. | 361/42 |
| 6,072,317 | A | 6/2000 | Mackenzie | |
| 6,084,756 | A | 7/2000 | Doring et al. | |
| 6,160,322 | A * | 12/2000 | Gotoh et al. | 307/106 |
| 6,163,144 | A * | 12/2000 | Steber et al. | 324/67 |
| 6,215,378 | B1 | 4/2001 | Gibson et al. | |
| 6,285,534 | B1 | 9/2001 | Gibson et al. | |
| 6,380,501 | B1 * | 4/2002 | Figueroa et al. | 200/308 |
| 6,392,513 | B1 | 5/2002 | Whipple et al. | |
| 6,522,228 | B2 | 2/2003 | Wellner et al. | |
| 6,522,509 | B1 | 2/2003 | Engel et al. | |
| 6,542,056 | B2 | 4/2003 | Nerstrom et al. | |
| 6,710,687 | B2 | 3/2004 | Elms et al. | |

(Continued)

*Primary Examiner*—Timothy J Dole
*Assistant Examiner*—Hoai-An D Nguyen
(74) *Attorney, Agent, or Firm*—Bradley J. Diedrich

(57) ABSTRACT

An arc fault circuit breaker includes a housing, separable contacts, an operating mechanism adapted to open and close the separable contacts, and an arc fault trip mechanism cooperating with the operating mechanism to trip open the separable contacts. The arc fault trip mechanism includes an arc fault test circuit adapted to simulate an arc fault trip condition to trip open the separable contacts. A proximity sensor, such as a Hall effect sensor, is adapted to sense a magnetic target to actuate the arc fault test circuit.

22 Claims, 3 Drawing Sheets

U.S. PATENT DOCUMENTS

| | | | | |
|---|---|---|---|---|
| 6,710,688 | B2 | 3/2004 | Wellner et al. | |
| 6,720,872 | B1 | 4/2004 | Engel et al. | |
| 6,734,682 | B2 | 5/2004 | Tallman et al. | |
| 6,744,260 | B2 | 6/2004 | Schmalz et al. | |
| 6,765,390 | B2 | 7/2004 | Elms | |
| 6,870,115 | B1 * | 3/2005 | Slepian | 200/401 |
| 6,897,783 | B2 * | 5/2005 | Zeng et al. | 340/635 |
| 6,900,641 | B2 * | 5/2005 | Draggie et al. | 324/418 |
| 7,034,644 | B2 * | 4/2006 | Moldovan et al. | 335/205 |
| 2003/0030954 | A1 * | 2/2003 | Bax et al. | 361/87 |
| 2006/0080063 | A1 * | 4/2006 | Vaughn | 702/187 |

* cited by examiner

METHOD OF ACTUATING A TEST FUNCTION OF AN ELECTRICAL SWITCHING APPARATUS AND ELECTRICAL SWITCHING APPARATUS EMPLOYING THE SAME

BACKGROUND OF THE INVENTION

1. Field of the Invention

This invention relates to electrical switching apparatus and, more particularly, to circuit interrupters, such as, for example, aircraft or aerospace circuit breakers providing arc fault protection. The invention also relates to a method of actuating a test function of an electrical switching apparatus, such as, for example, an arc fault test of an aircraft or aerospace circuit breaker.

2. Background Information

Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Subminiature circuit breakers are used, for example, in aircraft or aerospace electrical systems where they not only provide overcurrent protection but also serve as switches for turning equipment on and off. Such circuit breakers must be small to accommodate the high-density layout of circuit breaker panels, which make circuit breakers for numerous circuits accessible to a user. Aircraft electrical systems, for example, usually consist of hundreds of circuit breakers, each of which is used for a circuit protection function as well as a circuit disconnection function through a push-pull handle.

Typically, subminiature circuit breakers have provided protection against persistent overcurrents implemented by a latch triggered by a bimetal responsive to $I^2R$ heating resulting from the overcurrent. There is a growing interest in providing additional protection, and most importantly arc fault protection.

During sporadic arc fault conditions, the overload capability of the circuit breaker will not function since the root-mean-squared (RMS) value of the fault current is too small to actuate the automatic trip circuit. The addition of electronic arc fault sensing to a circuit breaker can add one of the elements required for sputtering arc fault protection—ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006.

Common methods of actuating a test function on, for example, a circuit breaker, include employing a mechanical pushbutton switch. See, for example, U.S. Pat. Nos. 5,982,593; 5,459,630; 5,293,522; 5,260,676; and 4,081,852. However, such mechanical mechanisms often fail due to mechanical stress and may be actuated by mistake. Furthermore, such mechanical mechanisms, when employed on a relatively small circuit breaker, such as, for example, a sub-miniature circuit breaker, are of relatively large size.

Proximity sensors include, for example, Hall effect sensors. These sensors, used in automatic metal detectors, change their electrical characteristics when exposed to a magnet. Usually, such sensors have three wires for supply voltage, signal and ground.

There is room for improvement in electrical switching apparatus employing a test function and in methods of actuating a test function of an electrical switching apparatus.

SUMMARY OF THE INVENTION

These needs and others are met by the present invention, which actuates a test function of an electrical switching apparatus by employing a proximity sensor with the electrical switching apparatus to sense a target. Then, responsive to sensing the target, the test function of the electrical switching apparatus is actuated.

In accordance with one aspect of the invention, a method of actuating a test function of an electrical switching apparatus comprises: employing a proximity sensor with the electrical switching apparatus; sensing a target with the proximity sensor; and responsive to the sensing a target, actuating the test function of the electrical switching apparatus.

The method may include employing the electrical switching apparatus including a housing having an opening, and disposing the proximity sensor within the housing proximate the opening thereof.

The method may also include employing the target having a keyed shape, and keying the opening to accept the keyed shape of the target.

As another aspect of the invention, an electrical switching apparatus comprises: a housing; separable contacts; an operating mechanism adapted to open and close the separable contacts; and a trip mechanism cooperating with the operating mechanism to trip open the separable contacts, the trip mechanism comprising: a test circuit adapted to simulate a trip condition to trip open the separable contacts, and a proximity sensor adapted to sense a target to actuate the test circuit.

The housing may include an opening, and the proximity sensor may be disposed within the housing proximate the opening thereof.

The target may have a keyed shape, and the opening may be keyed to accept the keyed shape of the target.

The proximity sensor may include an output, which is actuated when the target is sensed, and the test circuit may include a processor having an input receiving the output of the proximity sensor and also having an output. The output of the processor may be actuated responsive to the input of the processor receiving the actuated output of the proximity sensor. The trip mechanism may be an arc fault trip mechanism, and the output of the processor may include a pulse train signal to simulate an arc fault trip condition for the arc fault trip mechanism.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The present invention is described in association with an aircraft or aerospace arc fault circuit breaker, although the invention is applicable to a wide range of electrical switching apparatus, such as, for example, circuit interrupters adapted to detect a wide range of faults, such as, for example, arc faults or ground faults in power circuits.

Figure 1:
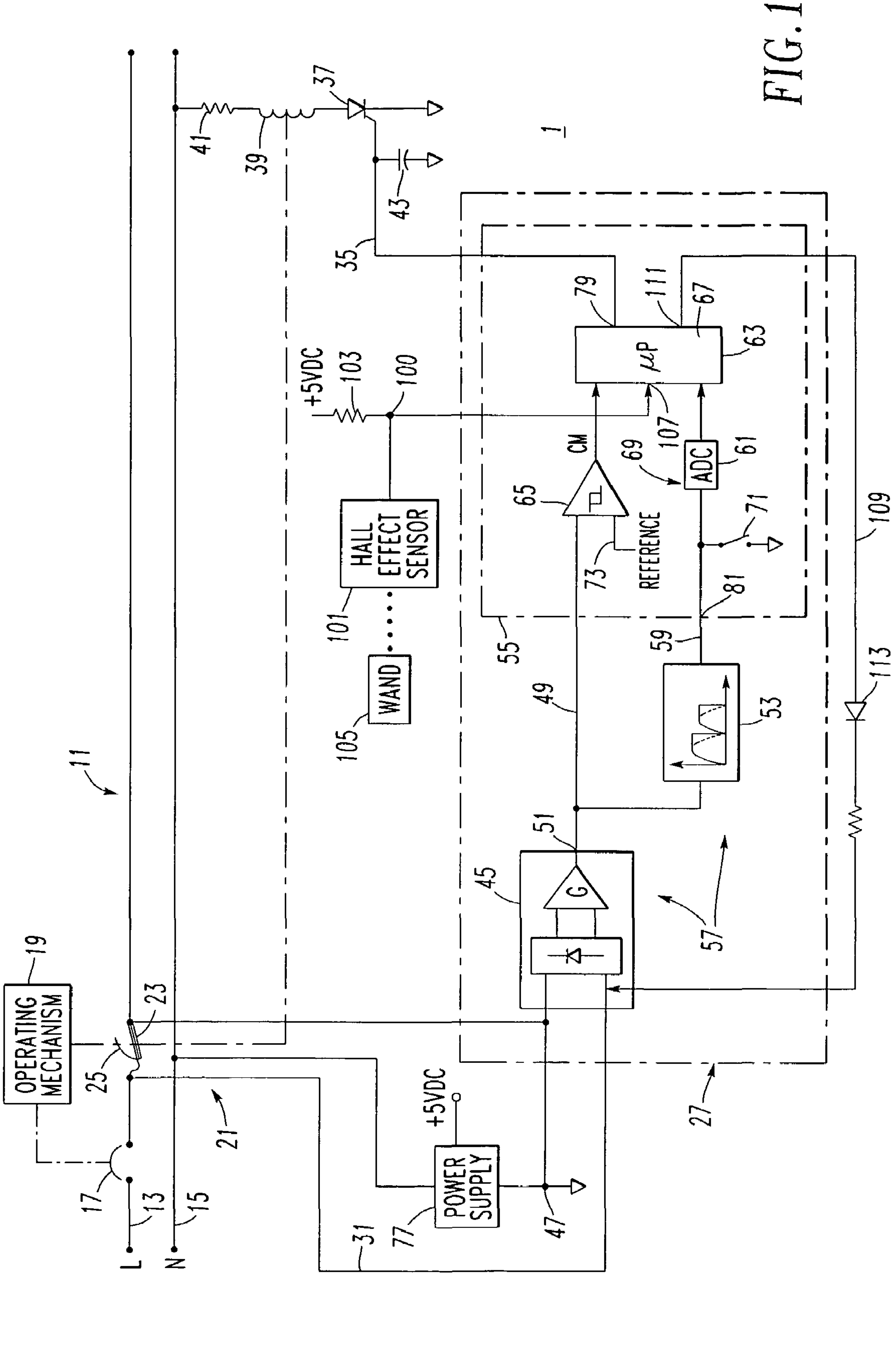
FIG. 1 is a block diagram of a circuit breaker including a Hall effect sensor to actuate an arc fault test function in accordance with the present invention.

Referring to FIG. 1, an arc fault circuit breaker 1 is connected in an electric power system 11 which has a line conductor (L) 13 and a neutral conductor (N) 15. The circuit breaker 1 includes separable contacts 17 which are electrically connected in the line conductor 13. The separable contacts 17 are opened and closed by an operating mechanism 19. In addition to being operated manually by a handle (not shown), the operating mechanism 19 can also be actuated to open the separable contacts 17 by a trip assembly 21. This trip assembly 21 includes the conventional bimetal 23 which is heated by persistent overcurrents and bends to actuate the operating mechanism 19 to open the separable contacts 17. An armature 25 in the trip assembly 21 is attracted by the large magnetic force generated by very high overcurrents to also actuate the operating mechanism 19 and provide an instantaneous trip function.

The circuit breaker 1 is also provided with an arc fault detector (AFD) 27. The AFD 27 senses the current in the electrical system 11 by monitoring the voltage across the bimetal 23 through the lead 31 with respect to local ground reference 47. If the AFD 27 detects an arc fault in the electric power system 11, then a trip signal 35 is generated which turns on a switch such as the silicon controlled rectifier (SCR) 37 to energize a trip solenoid 39. The trip solenoid 39 when energized actuates the operating mechanism 19 to open the separable contacts 17. A resistor 41 in series with the coil of the solenoid 39 limits the coil current and a capacitor 43 protects the gate of the SCR 37 from voltage spikes and false tripping due to noise. Alternatively, the resistor 41 need not be employed.

The AFD 27 cooperates with the operating mechanism 19 to trip open the separable contacts 17 in response to an arc fault condition. The AFD 27 includes an active rectifier and gain stage 45, which rectifies and suitably amplifies the voltage across the bimetal 23 through the lead 31 and the local ground reference 47. The active rectifier and gain stage 45 outputs a rectified signal 49 on output 51 representative of the current in the bimetal 23. The rectified signal 49 is input by a peak detector circuit 53 and a microcontroller (μC) 55.

The active rectifier and gain stage 45 and the peak detector circuit 53 form a first circuit 57 adapted to determine a peak amplitude 59 of a rectified alternating current pulse based upon the current flowing in the electric power system 11. The peak amplitude 59 is stored by the peak detector circuit 53.

The μC 55 includes an analog-to-digital converter (ADC) 61, a microprocessor (μP) 63 and a comparator 65. The μP 63 includes one or more arc fault algorithms 67. The ADC 61 converts the analog peak amplitude 59 of the rectified alternating current pulse to a corresponding digital value for input by the μP 63. The μP 63, arc fault algorithm(s) 67 and ADC 61 form a second circuit 69 adapted to determine whether the peak amplitude of the current pulse is greater than a predetermined magnitude. In turn, the algorithm(s) 67 responsively employ the peak amplitude to determine whether an arc fault condition exists in the electric power system 11.

The μP 63 includes an output 71 adapted to reset the peak detector circuit 59. The second circuit 69 also includes the comparator 65 to determine a change of state (or a negative (i.e., negative-going) zero crossing) of the alternating current pulse of the current flowing in the electric power system 11 based upon the rectified signal 49 transitioning from above or below (or from above to below) a suitable reference 73 (e.g., a suitable positive value of slightly greater than zero). Responsive to this negative zero crossing, as determined by the comparator 65, the μP 63 causes the ADC 61 to convert the peak amplitude 59 to a corresponding digital value.

The example arc fault detection method employed by the AFD 27 is "event-driven" in that it is inactive (e.g., dormant) until a current pulse occurs as detected by the comparator 65. When such a current pulse occurs, the algorithm(s) 67 record the peak amplitude 59 of the current pulse as determined by the peak detector circuit 53 and the ADC 61, along with the time since the last current pulse occurred as measured by a timer (not shown) associated with the μP 63. The arc fault detection method then uses the algorithm(s) 67 to process the current amplitude and time information to determine whether a hazardous arc fault condition exists. Although an example AFD method and circuit are shown, the invention is applicable to a wide range of AFD methods and circuits. See, for example, U.S. Pat. Nos. 6,710,688; 6,542,056; 6,522,509; 6,522,228; 5,691,869; and 5,224,006.

An output 100 of a suitable proximity sensor, such as, for example and without limitation, a Hall effect sensor 101, is held "high" by a pull-up resistor 103. When the Hall effect sensor 101 is actuated, for example, by a suitable target, such as for example and without limitation, a magnetic wand 105, the sensor output 100 is driven low (e.g., by an open drain output). When the μP 63 determines that the input 107 is low, it outputs a suitable pulse train signal 109 on output 111. That signal 109 is fed back into the input of the active rectifier and gain stage 45. In turn, the pulse train signal 109 causes the AFD algorithms 67 to determine that there is an arc fault trip condition, albeit a test condition, such that the trip signal 35 is set. A blocking diode 113 is employed to prevent any current from flowing into the μP output 111.

Figure 2:
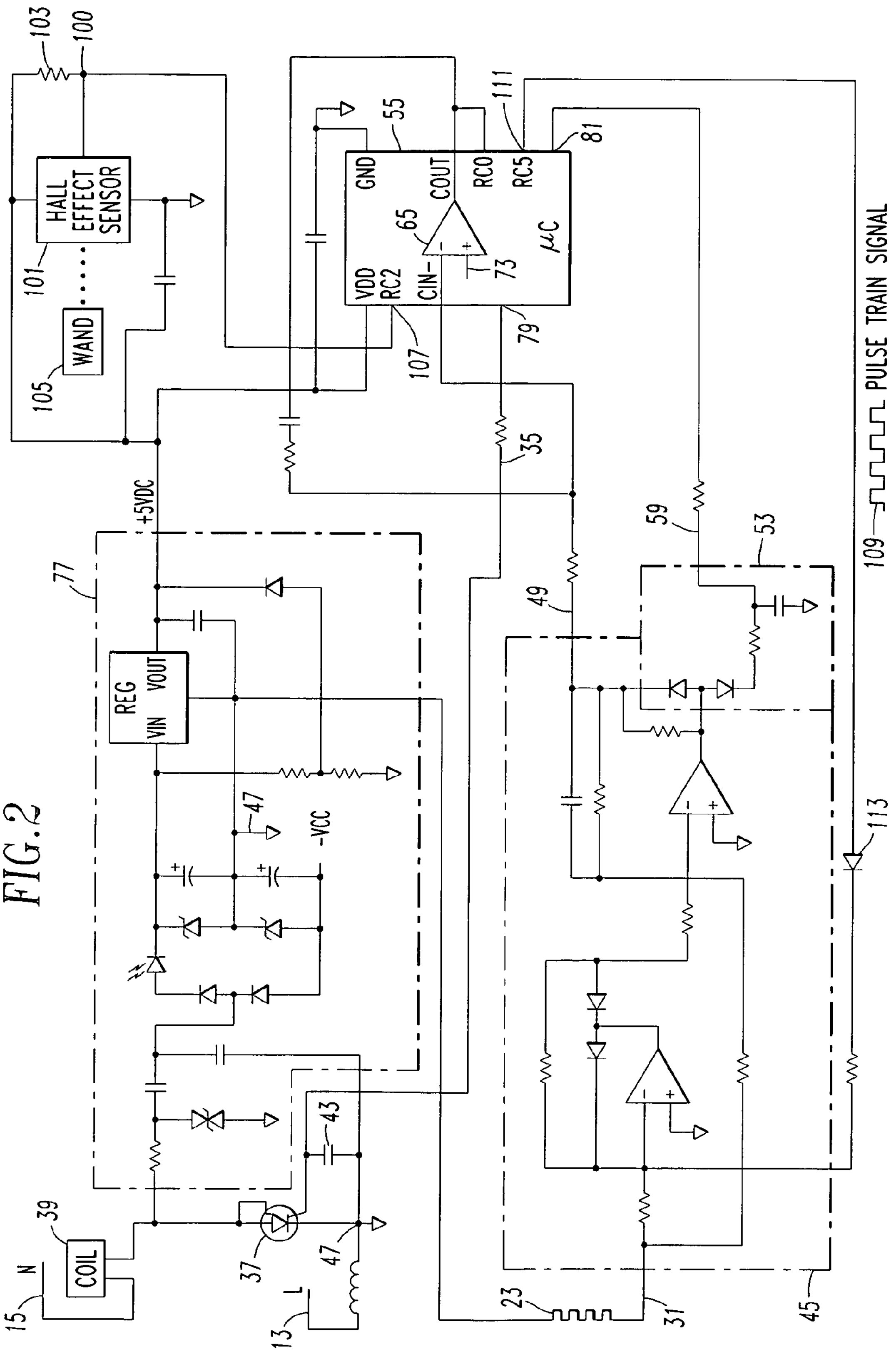
FIG. 2 is a block diagram in schematic form of the processor, power supply, active rectifier and gain stage, peak detector and Hall effect sensor of FIG. 1.

FIG. 2 is a block diagram in schematic form of the μC 55, power supply 77, active rectifier and gain stage 45, peak detector 53 and Hall effect sensor 101 of FIG. 1. The μC 55 may be, for example, a suitable processor, such as model PIC16F676 marketed by Microchip Technology Inc. of Chandler, Ariz. A digital output 79 includes the trip signal 35. An analog input 81 receives the peak amplitude 59 for the ADC 61 (FIG. 1). Digital input RCO of μC 55 is employed to read the output (COUT) of the comparator 65. Another digital input RC2 107 of μC 55 is employed to read the sensor output 100. Another digital output RC5 111 of μC 55 includes the pulse train signal 109 to simulate an arc fault trip condition responsive to the sensing the wand 105 with the sensor 101. The μC 55, thus, forms an arc fault trip mechanism including a test circuit adapted to simulate an arc fault trip condition to trip open the separable contacts 17 (FIG. 1).

Figure 3:
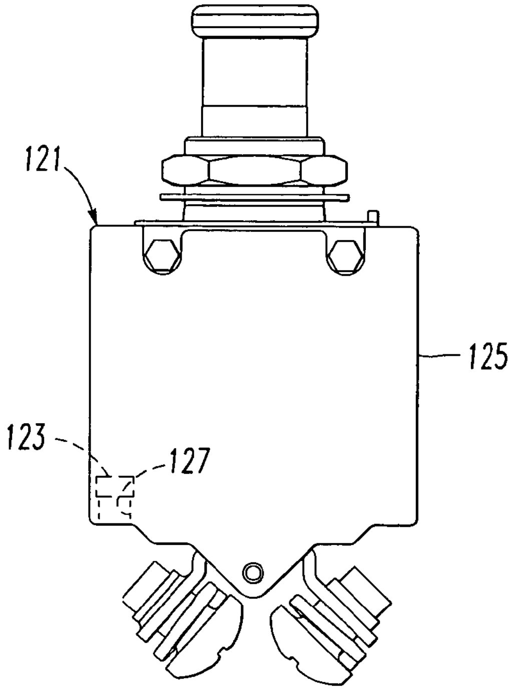
FIG. 3 is a vertical elevation view of an aircraft or aerospace circuit breaker including a Hall effect sensor in accordance with another embodiment of the invention.

FIG. 3 shows an aircraft or aerospace circuit breaker 121, which may be the same as or similar to the circuit breaker 1 of FIG. 1. A Hall effect sensor 123 (shown in hidden line drawing), which may be the same as or similar to the sensor 101 of FIG. 1, is disposed within a housing 125 and proximate an opening 127 as best shown in FIG. 4.

Figure 4:
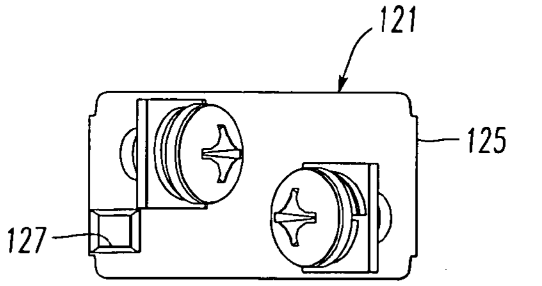
FIG. 4 is a bottom plan view of the aircraft or aerospace circuit breaker of FIG. 3.
Figure 5:
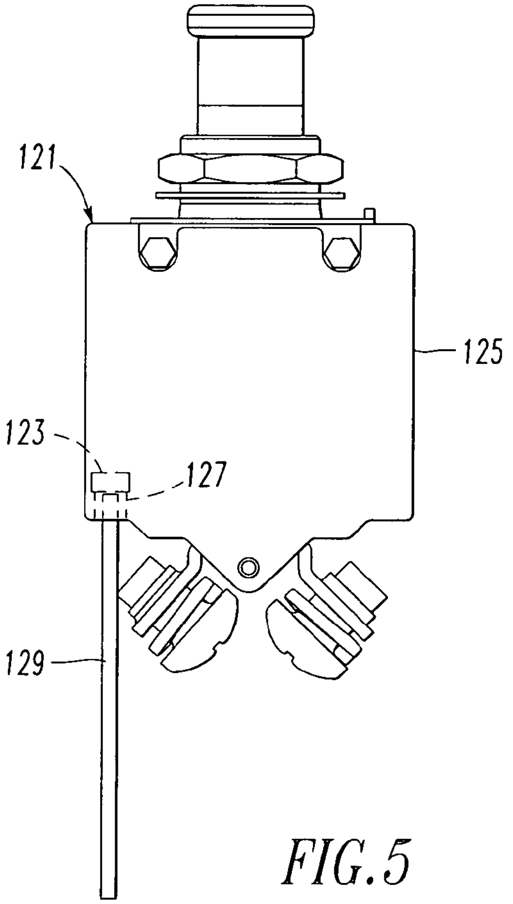
FIG. 5 is a view similar to FIG. 3, but with a magnetic wand inserted within the opening of FIG. 4 to actuate the Hall effect sensor of FIG. 3.

FIG. 5 shows a suitable target, such as a magnetic tool or magnetic wand 129, inserted a suitable distance within the opening 127 of FIG. 4 to actuate the Hall effect sensor 123 of FIG. 3, in order to output the pulse train signal 109 of FIG. 2.

Figure 6:
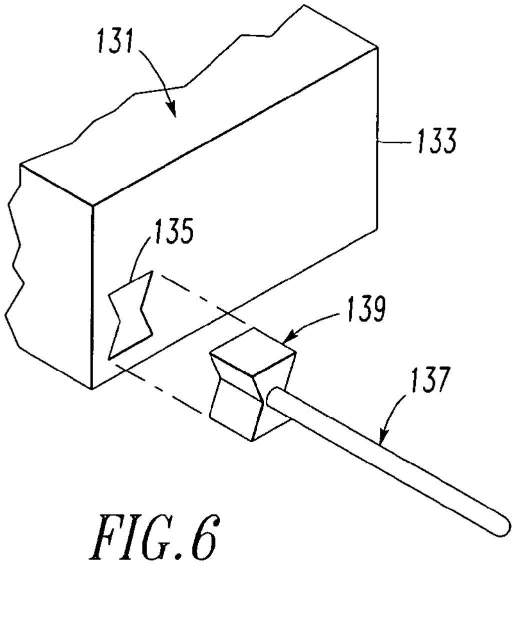
FIG. 6 an isometric view of another electrical switching apparatus including a keyed opening adapted to input a keyed target having a corresponding keyed shape in accordance with another embodiment of the invention.

FIG. 6 shows another electrical switching apparatus 131, which may be the same as or similar to the circuit breaker 1 of FIG. 1, including a housing 133 having keyed opening 135 adapted to input a keyed target 137 having a magnetic target with a corresponding keyed shape 139. Although an example keyed shape 139 is shown, any suitable shape and corresponding opening may be employed, in order to restrict use of the target to the keyed target 137, as shown.

The present invention provides a relatively easy way to test the trip electronics to verify the reliability of the circuit breakers 1,121 and electrical switching apparatus 131. A wand, such as 105, with a magnetic tip is inserted into a slot, such as opening 127 of the circuit breaker 121, in order that the magnetic tip is directly over the Hall effect sensor 123 of FIG. 3 or the sensor 101 of FIG. 1. The concentrated magnetic field over the Hall effect sensors 101,123 changes the state of the sensor output 100 (FIG. 1), which is electrically connected to the input 107 of the processor 63. When the sensor changes state, the input into the processor 63 changes, thereby informing such processor that the test function has been initiated. The processor 63, then, responsively outputs the pulse stream signal 109 that simulates an arcing event into the input stage of the AFD 27 that trips the arc fault circuit breaker 1.

Although a Hall effect digital sensor 101 is disclosed, any suitable proximity sensor may be employed. For example, an analog Hall effect sensor (not shown) may be employed, albeit with additional circuitry (not shown), in order to provide a suitable digital output, such as 100. As a further alternative to analog Hall effect sensors, a suitable magneto-resistive device (not shown) or a NAMUR inductive proximity sensor (not shown) (e.g., marketed by Turck, Inc. of Minneapolis, Minn.; Pepperl & Fuchs of Twinsburg, Ohio) may also be employed. Alternatively, a wide range of inductive proximity sensors (not shown) may be employed.

Although an arc fault test function is disclosed, any suitable test function, such as, for example and without limitation, a ground fault test function or any other suitable test function of an electrical switching apparatus may be employed.

Although an example AFD 27 is shown, it will be appreciated that a combination of one or more of analog, digital and/or processor-based circuits may be employed.

The disclosed Hall effect sensors 101,123 initiate a built-in test function of an electrical switching apparatus. These sensors reduce failure rate, improve reliability and employ a suitable tool, such as a magnetic wand 105,129, to actuate the corresponding sensor and, thus, the corresponding test function.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of actuating a trip test function of a circuit interrupter, said method comprising:
employing a proximity sensor in said circuit interrupter;
sensing a target with said proximity sensor; and
responsive to said sensing a target with said proximity sensor, actuating said trip test function of said circuit interrupter.

2. The method of claim 1 further comprising
employing said circuit interrupter including a housing having an opening; and
disposing said proximity sensor completely within said housing and proximate the opening thereof.

3. The method of claim 2 further comprising
employing as said target a magnetic target;
employing said magnetic target having a keyed shape; and
keying said opening to accept the keyed shape of said magnetic target.

4. The method of claim 1 further comprising
employing said circuit interrupter including an arc fault trip mechanism; and
outputting a pulse train signal to simulate an arc fault trip condition responsive to said sensing a target with said proximity sensor.

5. The method of claim 1 further comprising
employing as said proximity sensor a Hall effect sensor.

6. The method of claim 1 further comprising
employing as said target a magnetic target.

7. The method of claim 6 further comprising
employing a wand including said magnetic target.

8. A method of actuating a test function of a circuit interrupter, said method comprising:
employing a proximity sensor in said circuit interrupter;
sensing a target with said proximity sensor;
responsive to said sensing a target, actuating said test function of said circuit interrupter;
employing a circuit breaker including separable contacts as said circuit interrupter;
employing with said circuit breaker a trip mechanism including a test circuit adapted to simulate a trip condition to trip open said separable contacts; and
outputting a signal to simulate a trip condition to trip open said separable contacts responsive to said sensing a target with said proximity sensor.

9. The method of claim 8 further comprising
employing as said trip mechanism an arc fault trip mechanism.

10. The method of claim 9 further comprising
outputting a pulse train signal to simulate an arc fault trip condition responsive to said sensing a target with said proximity sensor.

11. An electrical switching apparatus comprising:
a housing;
separable contacts;
an operating mechanism adapted to open and close said separable contacts; and
a trip mechanism cooperating with said operating mechanism to trip open said separable contacts, said trip mechanism comprising:
a trip test circuit structured to simulate a trip condition to trip open said separable contacts, and
a proximity sensor structured to sense a target to actuate said trip test circuit.

12. The electrical switching apparatus of claim 11 wherein said housing includes an opening; and wherein said proximity sensor is disposed completely within said housing and proximate the opening thereof.

13. The electrical switching apparatus of claim 12 wherein said target is a magnetic target having a keyed shape; and wherein said opening is keyed to accept the keyed shape of said magnetic target.

14. The electrical switching apparatus of claim 11 wherein said trip mechanism is an arc fault trip mechanism; and wherein said trip test circuit is adapted to output a pulse train signal to simulate an arc fault trip condition to trip open said separable contacts.

15. The electrical switching apparatus of claim 11 wherein said proximity sensor is a Hall effect sensor.

16. The electrical switching apparatus of claim 11 wherein said target is a magnetic target.

17. The electrical switching apparatus of claim 11 wherein said target is a wand including a magnetic target.

18. The electrical switching apparatus of claim 11 wherein said proximity sensor includes an output which is actuated when said target is sensed; and wherein said trip test circuit includes a processor having an input receiving the output of said proximity sensor and also having an output.

19. The electrical switching apparatus of claim 18 wherein the output of said processor is actuated responsive to the input of said processor receiving the actuated output of said proximity sensor.

20. The electrical switching apparatus of claim 19 wherein said trip mechanism is an arc fault trip mechanism; and wherein the output of said processor includes a pulse train signal to simulate an arc fault trip condition for said arc fault trip mechanism.

21. A method of actuating a test function of a circuit interrupter, said method comprising:

employing a proximity sensor in said circuit interrupter;

sensing a target with said proximity sensor;

responsive to said sensing a target, actuating said test function of said circuit interrupter;

employing said circuit interrupter including a housing having an opening;

disposing said proximity sensor completely within said housing and proximate the opening thereof; and passing said target from outside of said housing, through the opening of said housing, and toward said proximity sensor.

22. The method of claim 21 further comprising employing as said target a magnetic target;

employing said magnetic target having a keyed shape; and keying said opening to accept the keyed shape of said magnetic target.

* * * * *